(12) United States Patent
Ren

(10) Patent No.: US 11,057,507 B2
(45) Date of Patent: Jul. 6, 2021

(54) ELECTRONIC ASSEMBLY AND ELECTRONIC DEVICE

(71) Applicant: GUANGDONG OPPO MOBILE TELECOMMUNICATIONS CORP., LTD., Guangdong (CN)

(72) Inventor: Zhiguo Ren, Guangdong (CN)

(73) Assignee: GUANGDONG OPPO MOBILE TELECOMMUNICATIONS CORP., LTD., Dongguan (CN)

( * ) Notice: Subject to any disclaimer, the term of this patent is extended or adjusted under 35 U.S.C. 154(b) by 0 days.

(21) Appl. No.: 16/756,331

(22) PCT Filed: Dec. 4, 2018

(86) PCT No.: PCT/CN2018/119164
§ 371 (c)(1),
(2) Date: Apr. 15, 2020

(87) PCT Pub. No.: WO2019/128645
PCT Pub. Date: Jul. 4, 2019

(65) Prior Publication Data
US 2020/0288004 A1    Sep. 10, 2020

(30) Foreign Application Priority Data
Dec. 29, 2017    (CN) .......................... 201711486637.6

(51) Int. Cl.
*H04M 1/02*    (2006.01)
*H04B 1/3827*    (2015.01)
(Continued)

(52) U.S. Cl.
CPC .......... *H04M 1/0266* (2013.01); *G06F 3/041* (2013.01); *H01R 43/00* (2013.01); *H04B 1/3827* (2013.01);
(Continued)

(58) Field of Classification Search
CPC .... H04M 1/02; H04M 1/10277; H04M 1/026; H04B 1/38; H04B 1/3827; H04B 1/40
See application file for complete search history.

(56) References Cited

U.S. PATENT DOCUMENTS 10,594,845 B2 *    3/2020    Hebert ................ H04M 1/0262
2014/0071081 A1    3/2014    Shedletsky et al.
(Continued)

FOREIGN PATENT DOCUMENTS

CN    104052838 A    9/2014
CN    204119279 U    1/2015
(Continued)

OTHER PUBLICATIONS

English translation of the Office Action 1 issued in corresponding CN application No. 201711486637.6 dated Jul. 1, 2020.
(Continued)

*Primary Examiner* — Blane J Jackson

(57) ABSTRACT

An electronic assembly and an electronic device are provided. The electronic assembly includes a receiver, a first circuit board, a flashlight, a second circuit board, and a sensor. The first circuit board has a first surface and a second surface opposite to the first surface, the receiver is disposed on the first surface and electrically connected to the first circuit board, the flashlight is disposed on the second surface and electrically connected to the first circuit board, the second circuit board is disposed on one side of the receiver away from the first circuit board, the sensor is disposed on one side of the second circuit board away from the receiver and is electrically connected to the second circuit board.

20 Claims, 22 Drawing Sheets

(51) Int. Cl.
  *G06F 3/041* (2006.01)
  *H01R 43/00* (2006.01)
  *H04M 1/03* (2006.01)
  *H04M 1/22* (2006.01)
  *H05K 1/18* (2006.01)

(52) U.S. Cl.
  CPC .......... *H04M 1/0274* (2013.01); *H04M 1/03* (2013.01); *H04M 1/22* (2013.01); *H05K 1/189* (2013.01); *H05K 2201/10151* (2013.01)

(56) References Cited

U.S. PATENT DOCUMENTS

| | | | | |
|---|---|---|---|---|
| 2015/0105128 | A1* | 4/2015 | Huang | G06F 3/0444 455/575.8 |
| 2017/0134545 | A1 | 5/2017 | Lee et al. | |
| 2018/0156964 | A1* | 6/2018 | Song | G02F 1/1368 |
| 2019/0253540 | A1* | 8/2019 | Fan | H04M 1/0235 |

FOREIGN PATENT DOCUMENTS

| | | |
|---|---|---|
| CN | 104470206 A | 3/2015 |
| CN | 105722345 A | 6/2016 |
| CN | 205485738 U | 8/2016 |
| CN | 106132087 A | 11/2016 |
| CN | 106843389 A | 6/2017 |
| CN | 206332721 U | 7/2017 |
| CN | 107395812 A | 11/2017 |

OTHER PUBLICATIONS

International search report issued in corresponding International application No. PCT/CN2018/119164 dated Feb. 27, 2019.
Second office action and translation issued in corresponding Chinese application No. 201711486637.6 dated Jan. 25, 2021.
The extended European search report issued in corresponding European application No. 18894752.7 dated Jan. 26, 2021.
Indian Examination Report for IN Application 202017015603 dated May 22, 2021. (5 pages).

* cited by examiner

ELECTRONIC ASSEMBLY AND ELECTRONIC DEVICE

CROSS-REFERENCE TO RELATED APPLICATION(S)

This application is a 371 application of International Application No. PCT/CN2018/119164, filed on Dec. 4, 2018, which claims priority to Chinese Patent Application No. 201711486637.6, filed on Dec. 29, 2017, the entire contents of both of which are incorporated herein by reference in their entireties.

TECHNICAL FIELD

This disclosure relates to the technical field of electronic devices, and particularly to an electronic assembly and an electronic device.

BACKGROUND

With the development of electronic devices, people hope that more devices can be integrated in mobile phones to achieve more diversified functions. However, due to the low space utilization of device arrangement and the small available space in existing mobile phones, it is difficult to add new devices to the existing mobile phones, which is not conducive to the diversification of mobile phone functions.

SUMMARY

An electronic assembly and an electronic device with high space utilization are provided.

An electronic assembly is provided according to implementations. The electronic assembly includes a receiver, a first circuit board, a flashlight, a second circuit board, and a sensor, where the first circuit board has a first surface and a second surface opposite to the first surface, the receiver is disposed on the first surface and electrically connected to the first circuit board, the flashlight is disposed on the second surface and electrically connected to the first circuit board, the second circuit board is disposed on one side of the receiver away from the first circuit board, the sensor is disposed on one side of the second circuit board away from the receiver, and the sensor is electrically connected to the second circuit board.

An electronic device is provided according to implementations. The electronic device includes the electronic assembly.

An electronic device is provided according to implementations. The electronic device includes a sensor, a receiver, a flashlight, and a display screen. The sensor, the receiver, and the flashlight are stacked in a thickness direction of the display screen. The display screen is provided with a groove at an edge of the display screen. The sensor and the receiver are at least partially directly facing the groove.

BRIEF DESCRIPTION OF DRAWINGS

In order to explain the technical solutions of the present application more clearly, the drawings used in the implementations are briefly introduced below. Obviously, the drawings in the following description are only some implementations of the present application. For those of ordinary skill in the art, other drawings can be obtained without creative efforts.

DETAILED DESCRIPTION

Technical solutions in implementations of the present application will be clearly and completely described below with reference to the accompanying drawings.

In order to understand the above-mentioned objects, features, and advantages of the present application more clearly, the present application is described in detail below with reference to the accompanying drawings and specific implementations. It should be noted that, the implementations as well as features in the implementations can be combined with each other without conflicts.

In the following description, many specific details are set forth for a fully understanding of the present application. However, the described implementations are only a part rather than all of the implementations of the present application. Based on the implementations provided herein, all other implementations obtained by those of ordinary skill in the art without creative efforts shall fall within the protection scope of this application.

Figure 1:
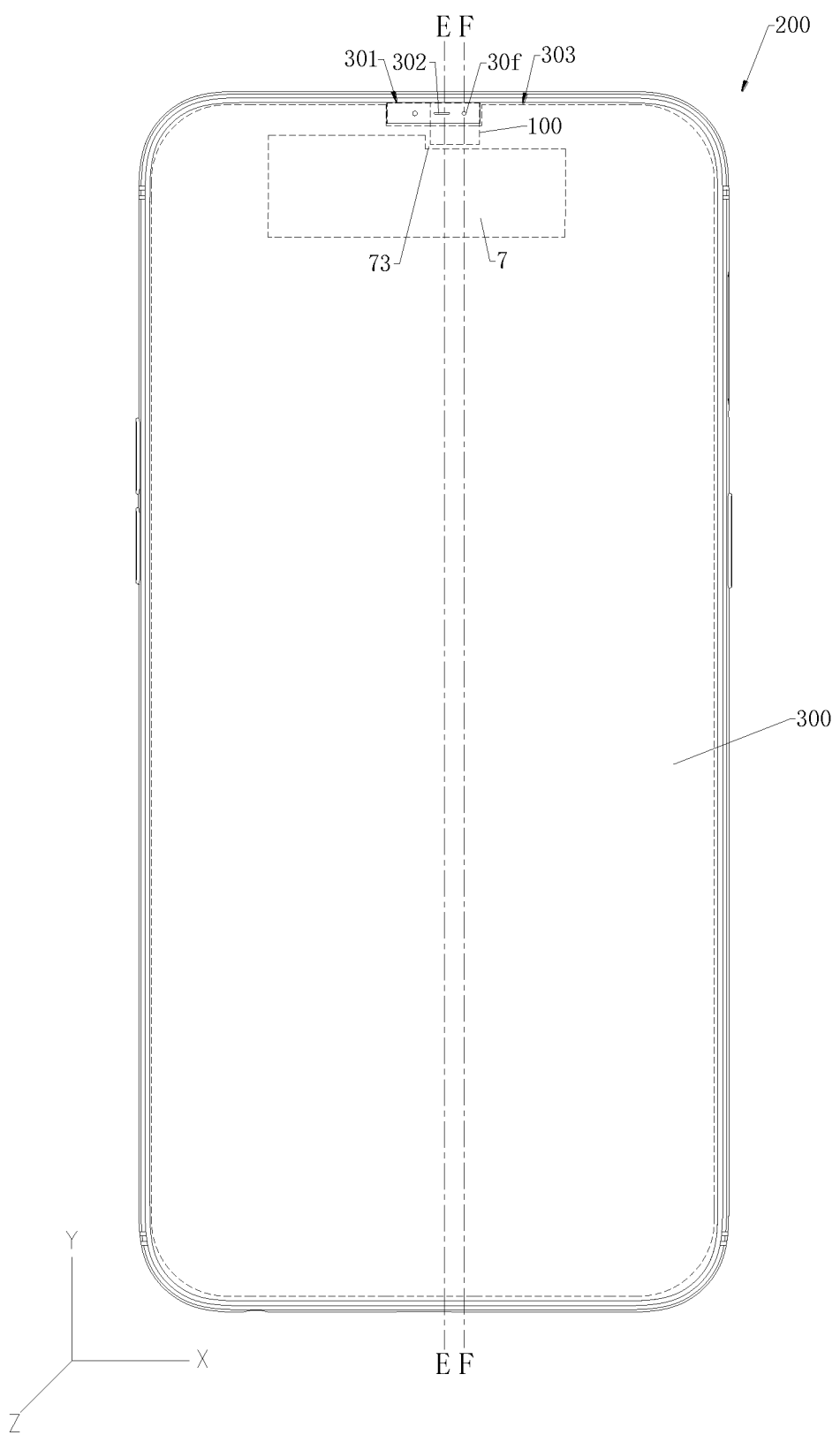
FIG. 1 is a schematic view illustrating an electronic device according to implementations.

According to implementations, as illustrated in FIG. 1, an electronic assembly 100 is provided. The electronic assembly 100 is applicable to an electronic device 200. The electronic device 200 may be a smart device such as a tablet computer, a mobile phone, a camera, a personal computer, a notebook computer, a vehicle-mounted device, or a wearable device. For ease of description, implementations are defined with reference to the electronic device 200 at a perspective illustrated in FIG. 1. In FIG. 1, the X direction represents the width direction of the electronic device 200, the Y direction represents the length direction of the electronic device 200, and the Z direction represents the thickness direction of the electronic device 200. It can be understood that the directional terms mentioned herein, for example, "length", "width", "thickness", etc., are only directions referring to the accompanying drawings. Therefore, the use of directional terms is for a better and clearer description and understanding of the application, rather than indicating or implying that the device or element referred to must have a specific orientation, be constructed and operated in a specific orientation, and therefore does not constitute a limitation on the application.

Figure 2:
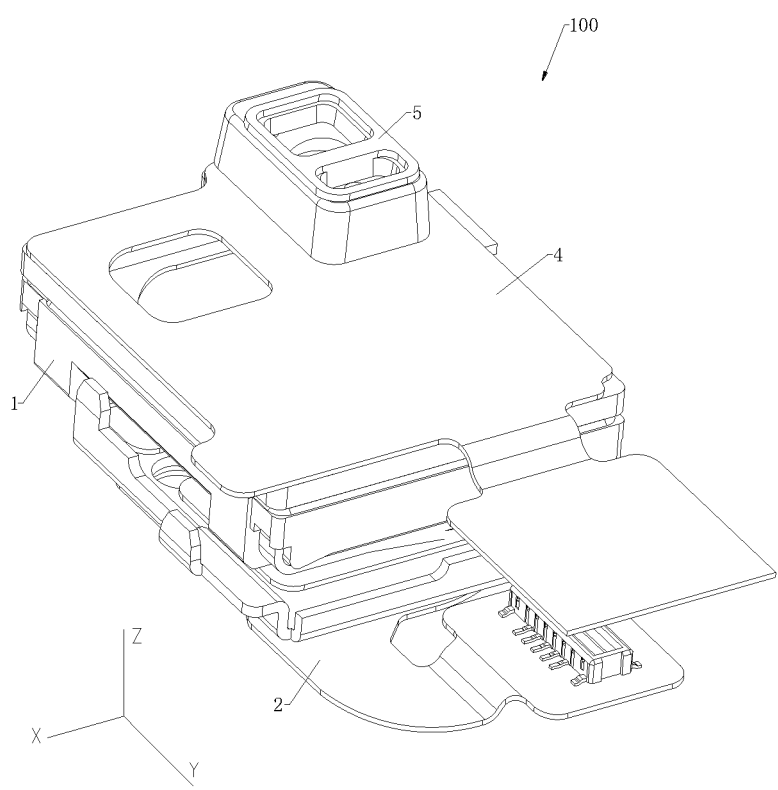
FIG. 2 is a schematic view illustrating an electronic assembly of the electronic device illustrated in FIG. 1.
Figure 3:
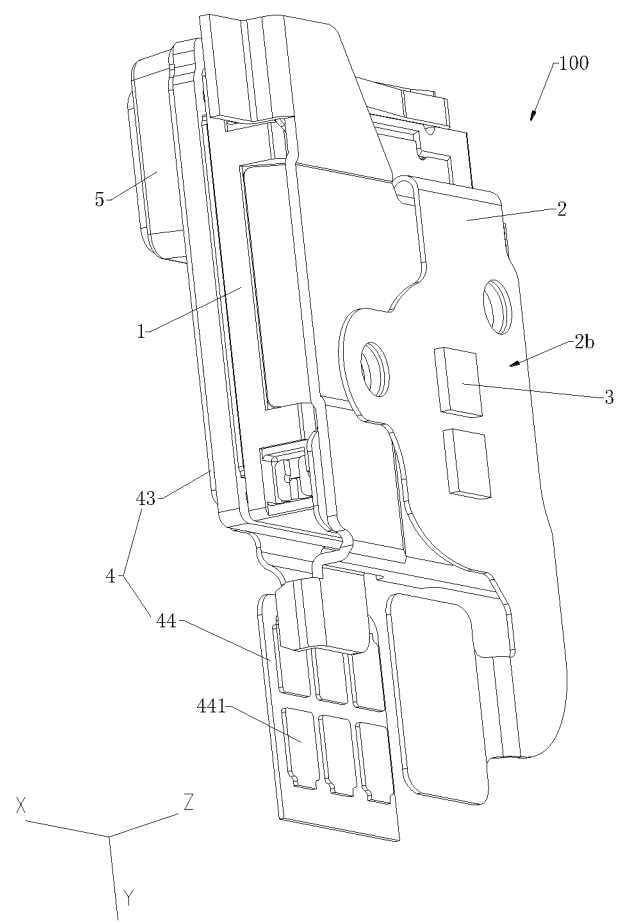
FIG. 3 is a schematic view illustrating the electronic assembly of FIG. 2 when viewed from another angle.
Figure 4:
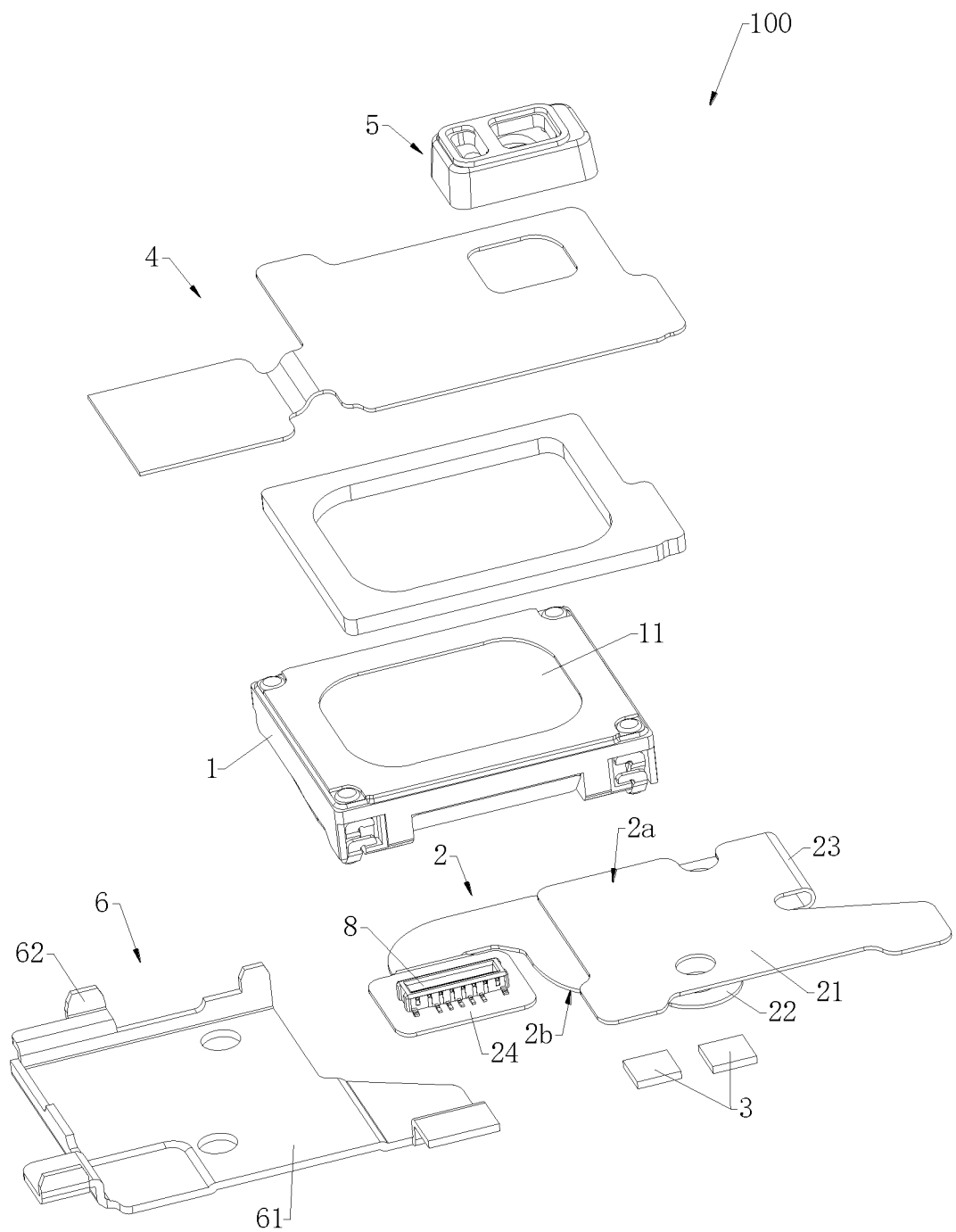
FIG. 4 is an exploded schematic view illustrating the electronic assembly illustrated in FIG. 2.

As illustrated in FIG. 2 to FIG. 4, the electronic assembly 100 includes a receiver 1, a first circuit board 2, a flashlight 3, a second circuit board 4, and a sensor 5. The first circuit board 2 has a first surface 2a and a second surface 2b, where the second surface is opposite to the first surface 2a. The receiver 1 is disposed on the first surface 2a and electrically connected to the first circuit board 2. The flashlight 3 is disposed on the second surface 2b and electrically connected to the first circuit board 2. The second circuit board 4 is disposed on one side of the receiver 1 away from the first circuit board 2. The sensor 5 is disposed on one side of the second circuit board 4 away from the receiver 1. The sensor 5 is electrically connected to the second circuit board 4.

The receiver 1, the first circuit board 2, the flashlight 3, the second circuit board 4, and the sensor 5 are stacked in turn, so that components of the electronic assembly 100 are compactly arranged, and the space utilization is high. When the electronic assembly 100 is used in an electronic device 200, since the arrangement of components in the electronic assembly 100 is relatively compact, the space occupied by the electronic assembly 100 inside the electronic device 200 is small. In this way, more other electronic devices can be disposed in the internal space of the electronic device 200, so that the space utilization of the electronic device 200 can be higher, and the functions of the electronic device 200 can be more diversified. In one implementation, the receiver 1, the first circuit board 2, the flashlight 3, the second circuit board 4, and the sensor 5 can be stacked in turn in the thickness direction Z of the electronic device 200, therefore, the size occupied by the electronic assembly 100 in the width direction X and the length direction Y of the electronic device 200 can be reduced.

Referring to FIG. 4 to FIG. 7, in one implementation, the first circuit board 2 is a flexible circuit board. The first circuit board 2 including a first part 21, a second part 22 opposite to the first part 21, and a bent third part 23 connected between the first part 21 and the second part 22. The first surface 2a is a surface of the first part 21 away from the second part 22. The receiver 1 is electrically connected to the first part 21. The second surface 2b is a surface of the second part 22 away from the first part 21. The flashlight 3 is electrically connected to the second part 22.

Figure 7:
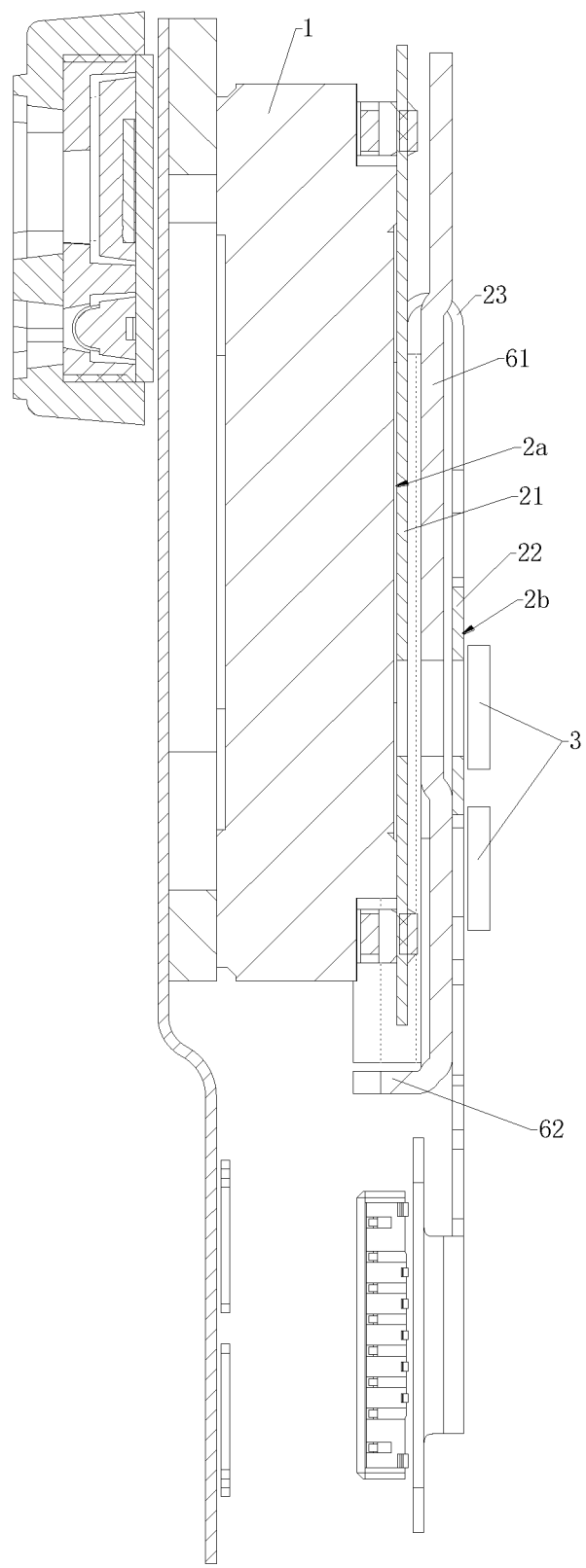
FIG. 7 is a cross-sectional view illustrating the electronic assembly illustrated in FIG. 6 taken along line A-A.
Figure 8:
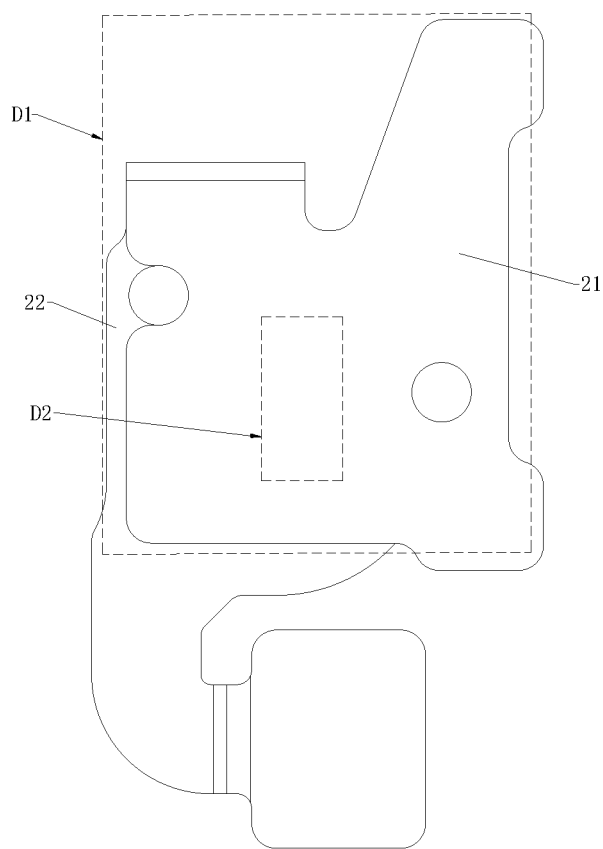
FIG. 8 is a schematic view illustrating a position relationship of a receiver, a flashlight, and the first circuit board of the electronic assembly illustrated in FIG. 2.

Referring to FIG. 3, FIG. 7, and FIG. 8, in one implementation, the first part 21 is parallel to the second part 22. Area D1 of an orthographic projection ("orthographic projection area" for short) of the flashlight 3 on the first part 21 falls into area D2 of an orthographic projection of the receiver 1 on the first part 21. In this implementation, the flashlight 3 completely overlaps with the receiver 1, this can further reduce the size occupied by the electronic assembly 100 in the width direction X or the length direction Y of the electronic device 200.

Figure 9:
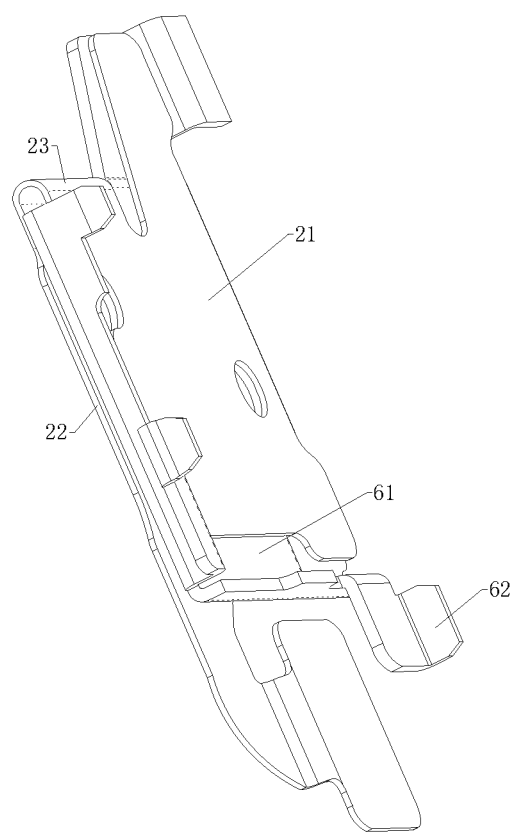
FIG. 9 is a schematic view illustrating cooperation between a support frame and the first circuit board of the electronic assembly illustrated in FIG. 2.

Referring to FIG. 4, FIG. 7, and FIG. 9, in one implementation, the electronic assembly 100 further includes a support frame 6. The support frame 6 includes a supporting portion 61 and a positioning portion 62 such as a positioning leg. The positioning portion 62 is connected to the supporting portion 61 and is used for fixing. The supporting portion 61 is located between the first part 21 and the second part 22.

Figure 10:
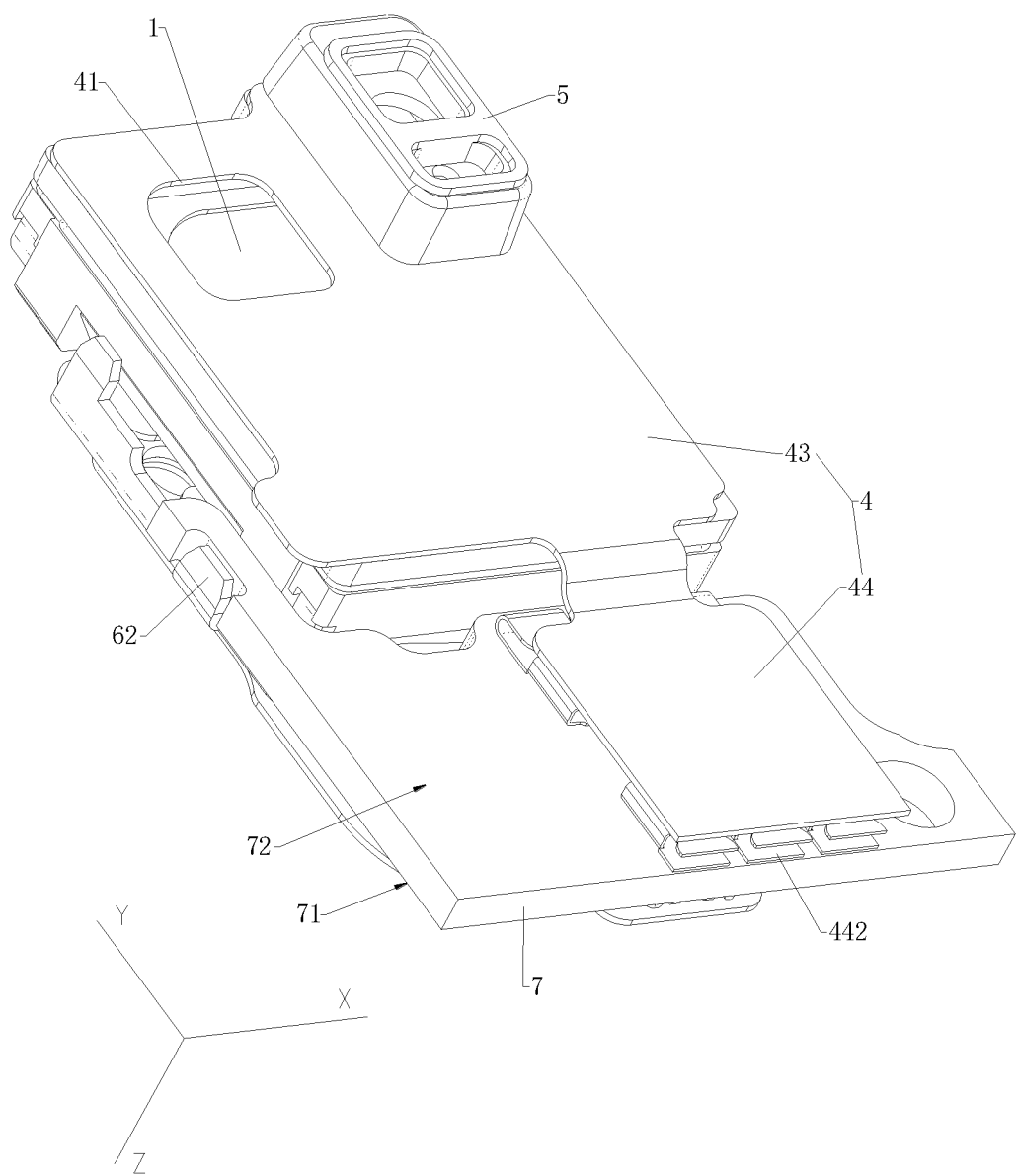
FIG. 10 is a schematic view illustrating cooperation between a main circuit board and the electronic assembly of the electronic device illustrated in FIG. 1.
Figure 11:
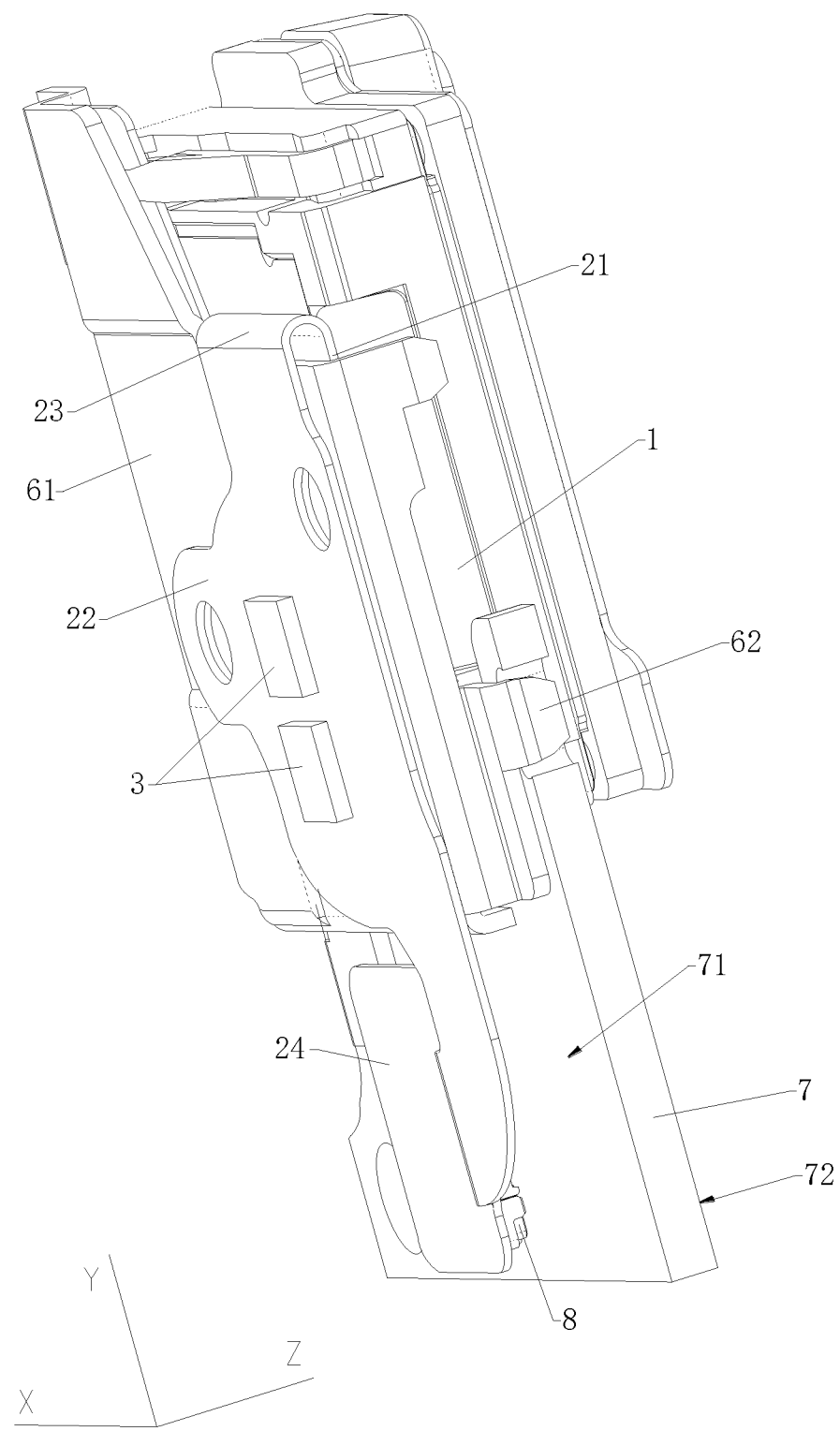
FIG. 11 is a schematic view illustrating the structure illustrated in FIG. 10 when viewed from another angle.

Referring to FIG. 9 to FIG. 11, when the positioning portion 62 is fixed to other components such as a main circuit board 7 of the electronic device 200, the support frame 6 is fixed relative to the main circuit board 7, such that the supporting portion 61 can support the first part 21 and the second part 22. Multiple positioning portions 62 can be provided. Part of the positioning portions 62 can be fixed to the main circuit board 7, and the rest of the positioning portions 62 can be fixed to a housing (such as a frame) of the electronic device 200 to increase the stability of the support frame 6 and make the electronic assembly 100 more stable.

In one implementation, the first part 21 is provided with a first reinforcing plate (not illustrated in the figures) on a surface facing the second part 22. The second part 22 is provided with a second reinforcing plate on one side facing the first part 21. Arrangement of the first reinforcing plate is beneficial to realize the electrical connection between the receiver 1 and the first part 21. The arrangement of the second reinforcing plate enables the flashlight 3 to be stably and firmly welded and fixed to the second part 22.

Figure 5:
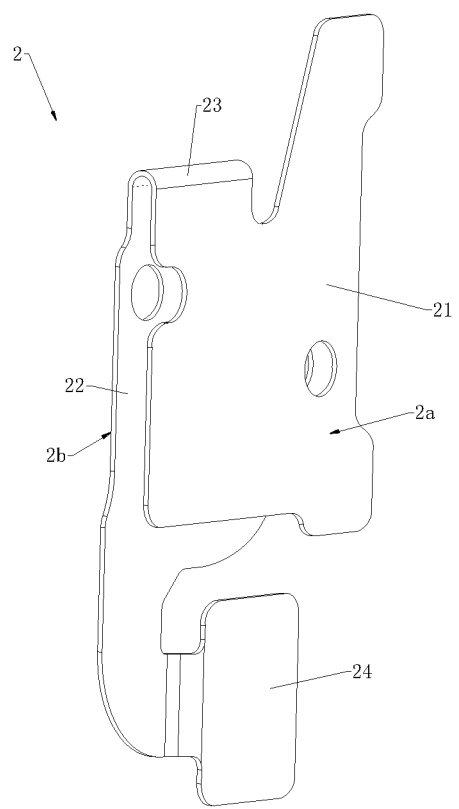
FIG. 5 is a schematic view illustrating a first circuit board of the electronic assembly illustrated in FIG. 2.

Referring to FIG. 4, FIG. 5, and FIG. 11, in one implementation, the first circuit board 2 further includes a fourth part 24. The fourth part 24 is connected to one side of the second part 22 away from the third part 23. The fourth part 24 is staggered with the receiver 1. In other words, the fourth part 24 does not overlap with the receiver 1. The fourth portion 24 extends from the second part 22 to be connected to other components such as the main circuit board 7 of the electronic device 200.

The fourth part 24 is provided with an electric connector 8 at one end away from the second part 22. The first circuit board 2 is electrically connected to the maid circuit board 7 via the electric connector 8. The receiver 1 is electrically connected to the main circuit board 7 via the first part 21, the third part 23, the second part 22, the fourth part 24, and the electric connector 8 to implement signal transmission. The flashlight 3 is electrically connected to the main circuit board 7 via the second part 22, the fourth part 24, and the electric connector 8 to implement signal transmission.

In the above implementation, the receiver 1 and the flashlight 3, together with the first circuit board 2 and the electric connector 8, are electrically connected to the main circuit board 7, this can save the manufacturing material of the electronic assembly 100, so that the cost of the electronic assembly 100 is lower.

Figure 12:
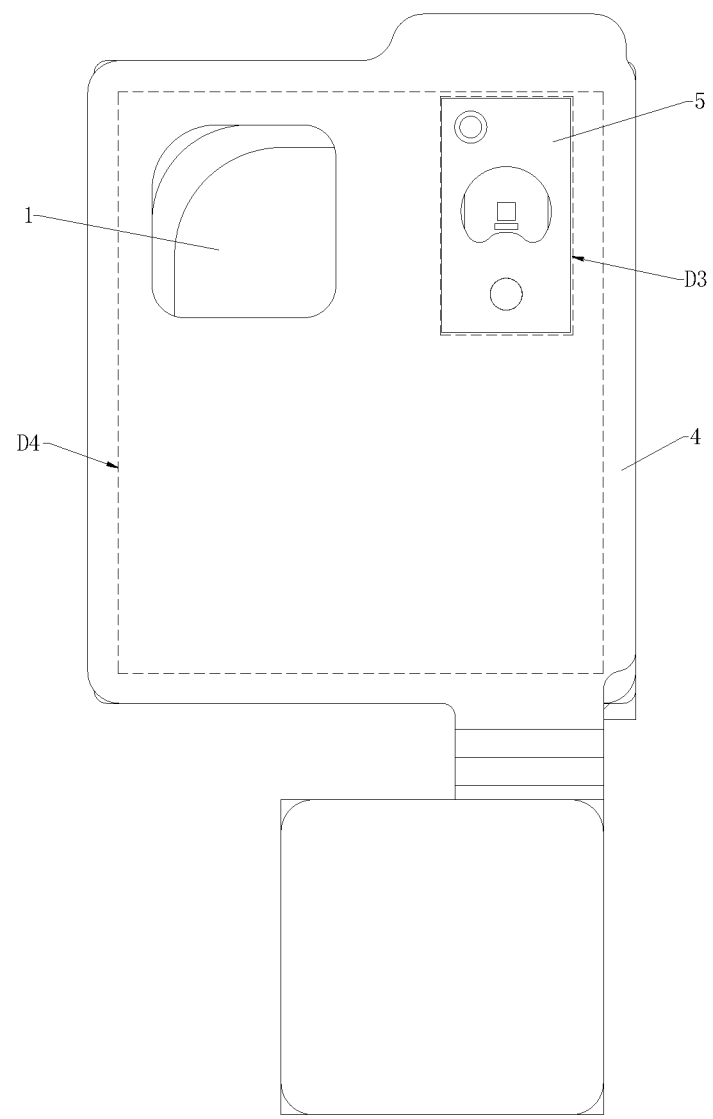
FIG. 12 is a schematic view illustrating a position relationship between the receiver, a sensor, and a second circuit board of the electronic assembly illustrated in FIG. 2.

Referring to FIG. 12, in one implementation, area D3 of an orthographic projection of the sensor 5 on the second circuit board 4 falls into area D4 of an orthographic projection of the receiver 1 on the second circuit board 4. In this implementation, the sensor 5 completely overlaps with the receiver 1. The sensor 5 and the flashlight 3 are disposed respectively on opposite sides of the receiver 1, directly facing each other, this can further reduce the size occupied by the electronic assembly 100 in the width direction X or the length direction Y of the electronic device 200.

Figure 13:
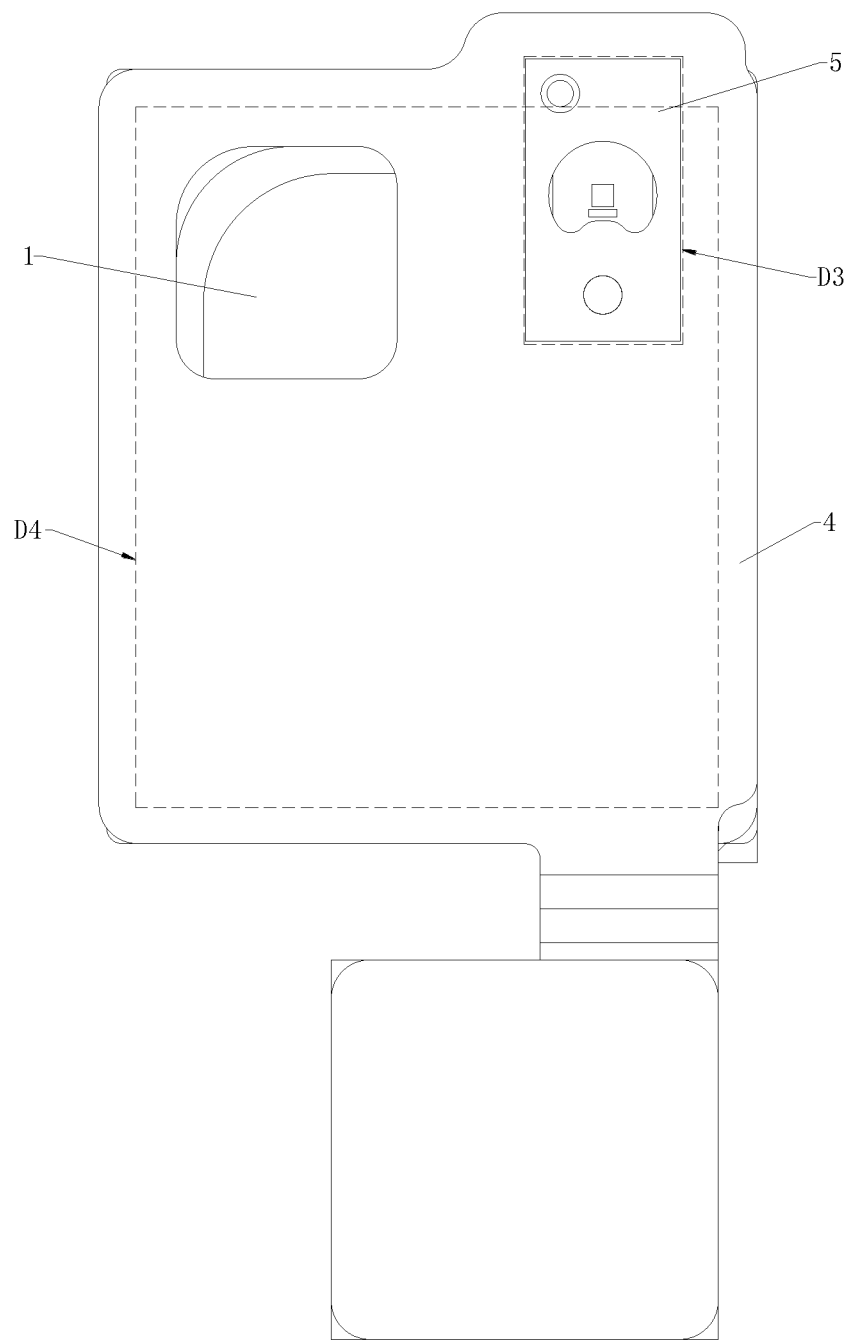
FIG. 13 is a schematic view illustrating another position relationship between the receiver, the sensor, and the second circuit board of the electronic assembly illustrated in FIG. 2.
Figure 14:
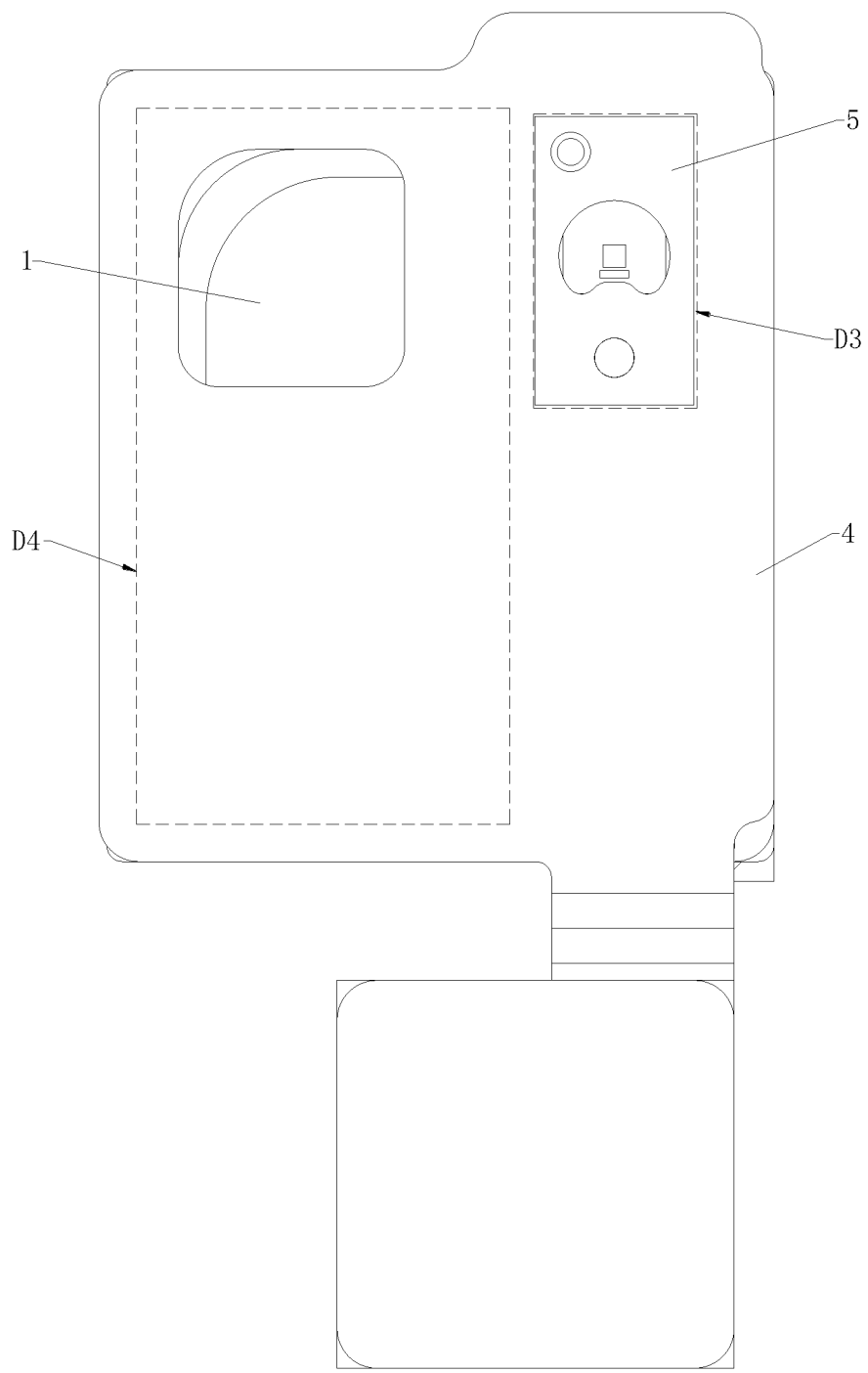
FIG. 14 is a schematic view illustrating another position relationship between the receiver, the sensor, and the second circuit board of the electronic assembly illustrated in FIG. 2.

In other implementations, as illustrated in FIG. 13, area D3 of an orthographic projection of the sensor 5 on the second circuit board 4 partially overlaps with area D4 of an orthographic projection of the receiver 1 on the second circuit board 4. Alternatively, as illustrated in FIG. 14, area D3 of an orthographic projection of the sensor 5 on the second circuit board 4 does not overlap with area D4 of an orthographic projection of the receiver 1 on the second circuit board 4.

Referring to FIG. 4, the receiver 1 is substantially rectangular. The receiver 1 is provided with a vibration portion 11 in the middle thereof. Generally, the vibration portion 11 is tightly connected to other components or structural members to form a vibration cavity. The sound waves generated through vibration of the vibration portion 11 can be propagated out through an opening defined in the component or the structural member. The receiver 1 propagates a sound signal through a sound channel, from a structural point of view, the sound channel corresponds to a channel from the vibration portion 11 to the opening of the component or the structural member. After the receiver 1 receives an audio signal, the enclosed vibration cavity vibrates accordingly, and the sound signal passes through the opening of the component or the structural member.

The sound channel of the receive 1 has various forms, as detailed below.

Figure 15:
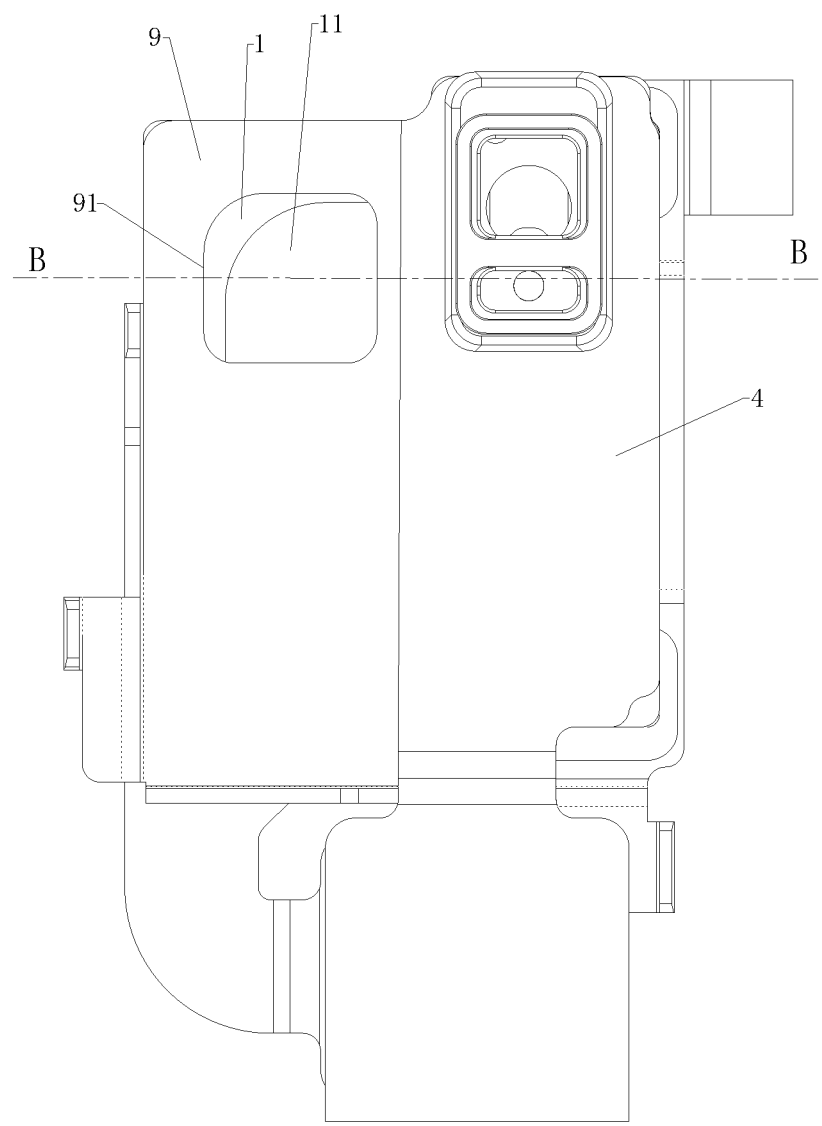
FIG. 15 is another schematic view illustrating the electronic assembly of the electronic device illustrated in FIG. 1.
Figure 16:
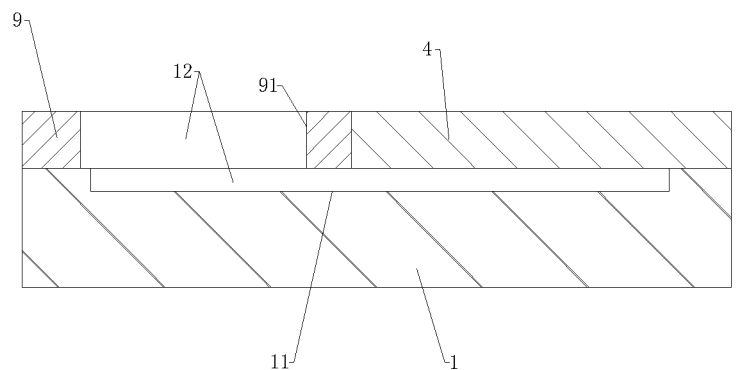
FIG. 16 is a schematic view illustrating part of the structure of the electronic assembly illustrated in FIG. 15 taken along line B-B.

In one implementation, as illustrated in FIG. 15 and FIG. 16, the second circuit board 4 partially covers the receiver 1 and is tightly connected to the receiver 1. The electronic assembly 100 further comprises a sealing member 9. The sealing member 9 is connected to the second circuit board 4. The sealing member 9 covers and is tightly connected to the rest of the receiver 1. The sealing member 9 defines a receiving hole 91 to form a sound channel 12 between the vibration portion 11 of the receiver 1 and the receiving hole 91 of the sealing member 9.

In the above implementation, the sealing member 9 and the second circuit board 4 seal the receiver 1 to form the vibration cavity. The sealing member 9 defines the receiving hole 91. The sound signal transmitted from the receiver 1 is sent out through the receiving hole 91 of the sealing member 9.

In one implementation, the sealing member 9 is a rectangular foam. The sealing member 9 can absorb manufacturing tolerances and assembly tolerances of the electronic assembly 100. In other implementations, the sealing member 9 can be a reinforcing plate made of metal or plastic.

An orthographic projection of the vibration portion 11 on the sealing member 9 at least partially covers the receiving hole 91 of the sealing member 9, such that the receiving hole 91 of the sealing member 9 can better output the sound signal.

Figure 17:
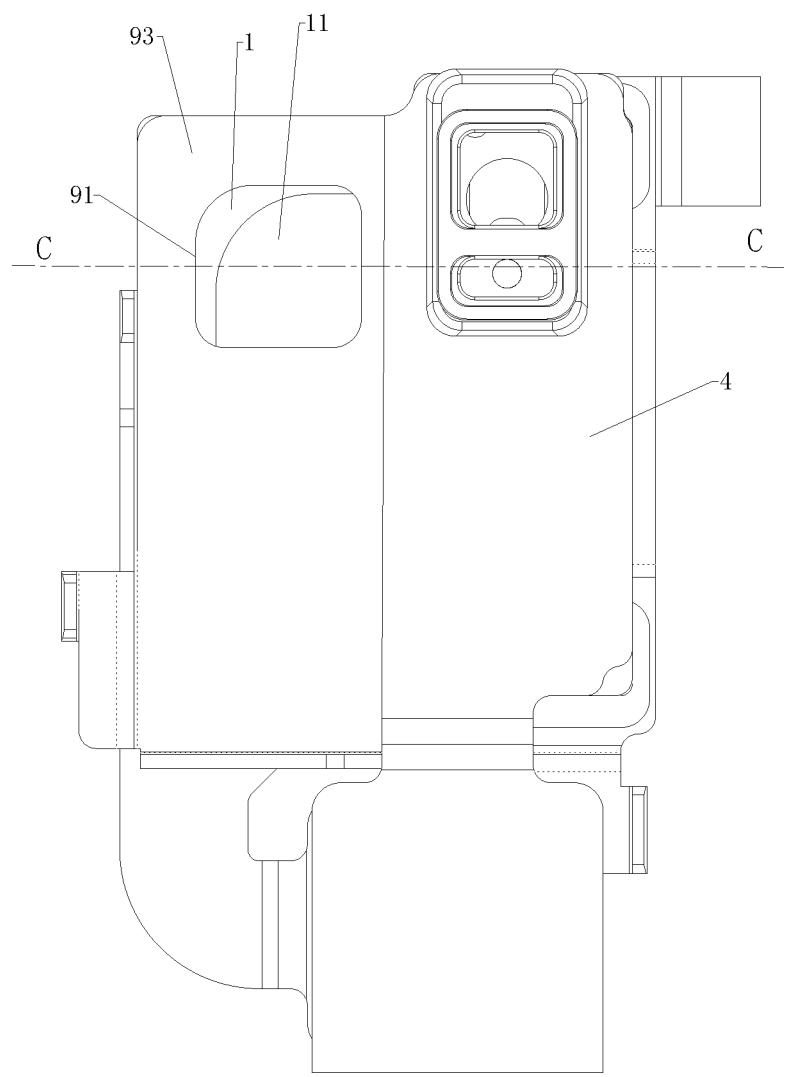
FIG. 17 is another schematic view illustrating the electronic assembly of the electronic device illustrated in FIG. 1.
Figure 18:
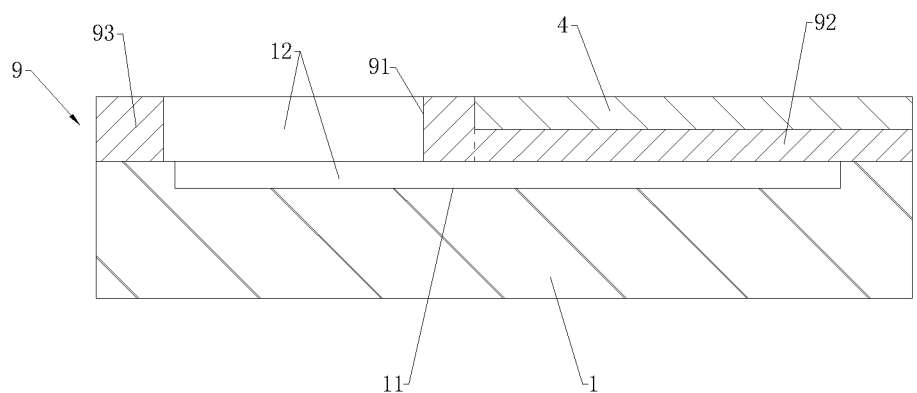
FIG. 18 is a schematic view illustrating part of the structure of the electronic assembly illustrated FIG. 17 taken along line C-C.

In one implementation, as illustrated in FIG. 17 and FIG. 18, the electronic assembly 100 further includes a sealing member 9. The sealing member 9 covers and is tightly connected to the receiver 1. The sealing member 9 has a first sealing portion 92 and a second sealing portion 93 connected to the first sealing portion 92. The first sealing portion 92 and the second sealing portion 93 are disposed side by side. The second sealing portion 93 has a thickness greater than the first sealing portion 92. The second circuit board 4 is stacked on the first sealing portion 92. The second circuit board 4 is located on a side of the first sealing portion 92 away from the receiver 1. The second sealing portion 93 defines a receiving hole 91, so as to form a sound channel between the vibration portion 11 of the receiver 1 and the receiving hole 91 of the sealing member 9.

The second sealing portion 93 has a thickness greater than the first sealing portion 92, such that the second sealing portion 93 forms a step with the first sealing portion 92, and the second circuit board 4 is disposed on the step. In other implementations, the sealing member 9 may also be a flat plate-like structure.

Since the sealing member 9 is provided to seal the receiver 1 to form the sound cavity, the electronic assembly 100 can be prevented from relying too much on the structure of the second circuit board 4 to support and seal the receiver 1, thereby further optimizing the structure of the electronic assembly 100.

The size of the second circuit board 4 is substantially the same as the size of the sensor 5. In any case, the sensor 5 is carried on the second circuit board 4, that is, the second circuit board 4 completely covers the sensor 5, without being affected by the fact that the size of the second circuit board 4 is too large and takes up too much space in the electronic device 200.

An orthographic projection of the vibration portion 11 on the sealing member 9 at least partially covers the receiving hole 91 of the sealing member 9, such that the receiving hole 91 of the sealing member 9 can better output sound signals.

Figure 6:
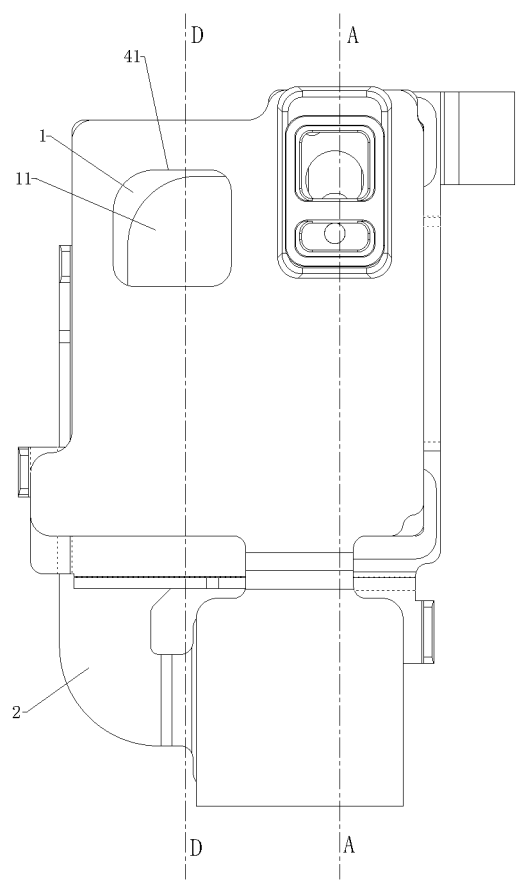
FIG. 6 is a schematic view illustrating the electronic assembly illustrated in FIG. 2 when viewed from another angle.
Figure 19:
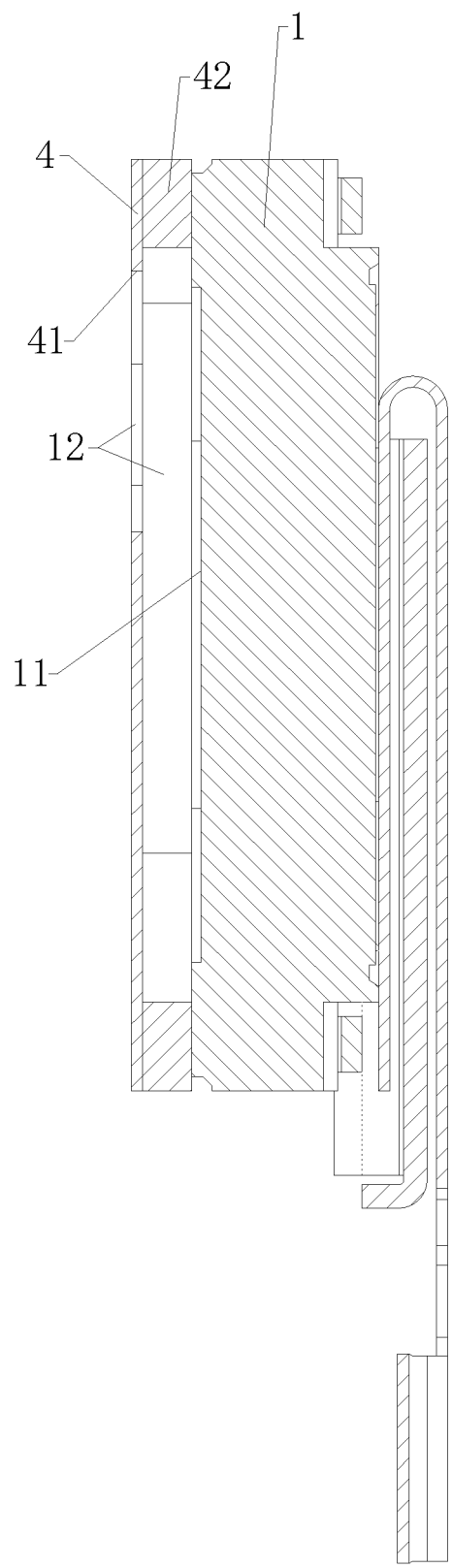
FIG. 19 is a cross-sectional view illustrating the electronic assembly illustrated in FIG. 6 taken along line D-D.
Figure 20:
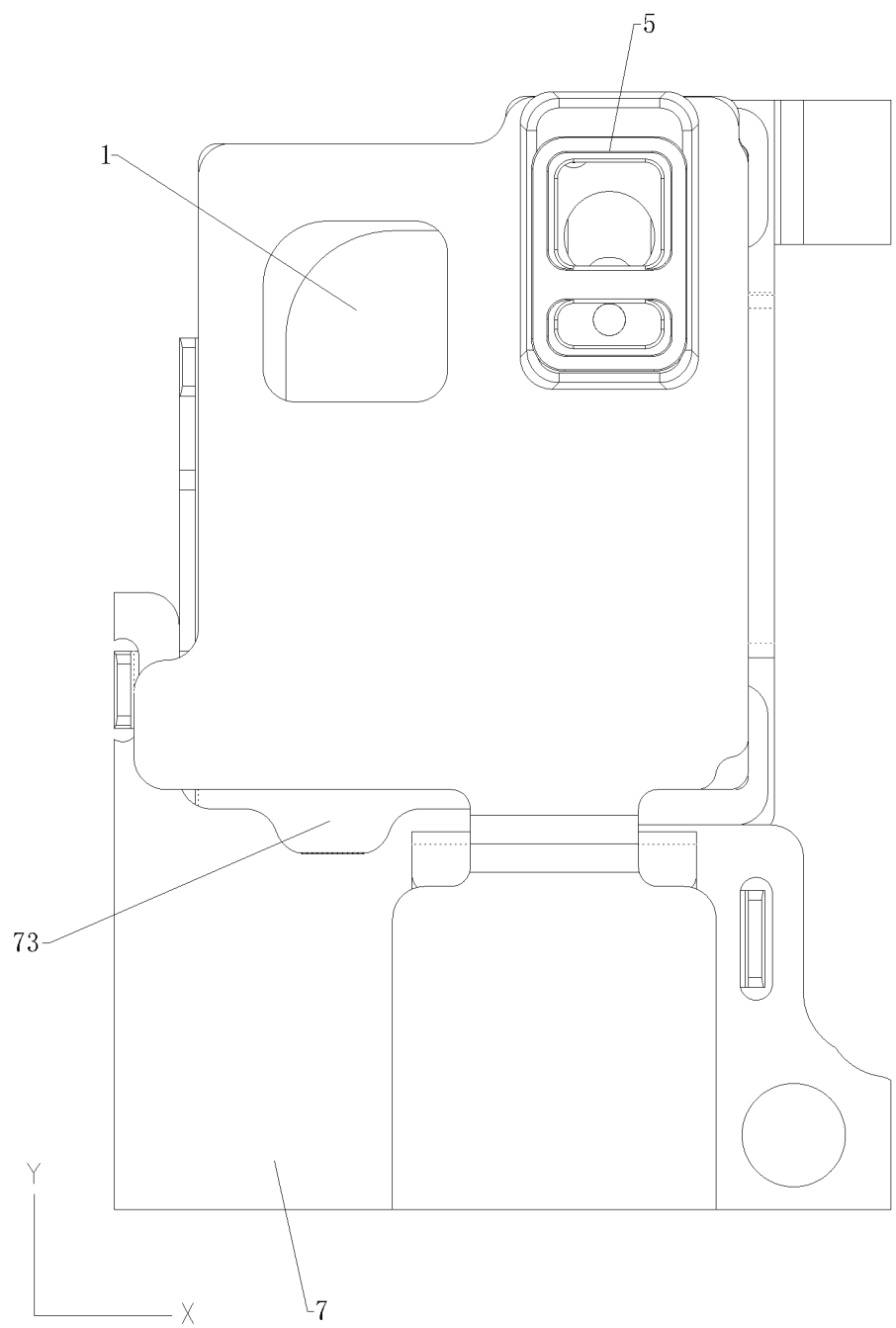
FIG. 20 is a schematic view illustrating the structure illustrated in FIG. 10 when viewed from another angle.

In some other implementations, as illustrated in FIG. 6 and FIG. 19, the second circuit board 4 covers and is tightly connected to the receiver 1. The second circuit board 4 is tightly connected to the receiver 1 in such a manner that a vibration cavity is formed. The second circuit board 4 defines a receiving hole 41 to form a sound channel 12 between the vibration portion 11 of the receiver 1 and the receiving hole 41 of the second circuit board 4. The sound channel 12 of the receiver 1 is connected to the outside through the second circuit board, such that the audio signal, which is converted into a sound signal by the receiver 1, can be sent out through the sound channel 12.

In the above implementation, the second circuit board 4 is not only a member for supporting the stacked sensor 5 and the receiver 1, but also a part of the sound channel 12 of the receiver 1, which reduces devices or components of the electronic assembly 100, makes the electronic assembly 100 more compact, saves the size of the electronic assembly 100 in the thickness direction Z of the electronic device 200, and improves space utilization.

In one implementation, the second circuit board 4 and the receiver 1 are connected (such as bonded) through a foam 42. The foam 42 is a hollow ring and is disposed on a side of the second circuit board 4 facing the receiver 1. The foam 42 is disposed along the edge of the vibration portion 11 of the receiver 1. As such, when the second circuit board 4 is tightly connected to the receiver 1, a cavity formed between the vibration portion 11 of the receiver 1 and the second circuit board 4 is part of the sound channel 12 of the receiver 1. In other implementations, the second circuit board 4 can be tightly connected to the receiver 1 through welding or gluing, which is not limited herein.

An orthographic projection of the vibration portion 11 on second circuit board 4 at least partially covers the receiving hole 41 of the second circuit board 4, such that the receiving hole 41 of the second circuit board 4 can better output the sound signal.

In one implementation, as illustrated in FIG. 3 and FIG. 10, the second circuit board 4 is a flexible circuit board. The second circuit board 4 includes a sealing portion 43 and a connecting portion 44. The sealing portion 43 is tightly connected to the receiver 1. The connecting portion 44 is connected to one side of the sealing portion 43. The connecting portion 43 is staggered from the receiver 1. In other words, the connecting portion 44 does not overlap with the receiver 1. The connecting portion 44 extends from the sealing portion 43 to be connected to other components such as the main circuit board 7 of the electronic device 200. The sensor 5 is electrically connected to the main circuit board 7 through the sealing portion 43 and the connecting portion 44, for signal transmission.

In one implementation, the connecting portion 44 is provided with a bonding pad 441 ("pad" for short) at one end away from the sealing portion 43. The main circuit board 7 is provided with a contact piece 442 such as an elastic sheet. The contact piece 442 resists the bonding pad 441 to achieve electrical connection. In other implementations, the connecting portion 44 can be electrically connected to the main circuit board 7 through an electrical connector.

The sensor 5 includes at least one of a distance sensor, a light sensor, or a photoelectric sensor. In this implementation, the sensor 5 is a light sensor. The light sensor is disposed near a screen of the electronic device 200 so as to adjust the brightness of the screen of the electronic device 200 according to the light in the environment where the electronic device 200 is situated in. Although the light sensor senses lights, the electronic device 200 however does not require special drilling or a special structure to allow the light to pass. The sensor 5 of the electronic assembly is embodied as a light sensor and is stacked, together with the receiver 1, in the thickness direction Z of the electronic device 200, which further optimizes the structure of the electronic device 200, makes the space utilization of the electronic device 200 higher, and is beneficial to reducing the size of the electronic device 200 in the width direction X and the length direction Y.

As illustrated in FIG. 10 and FIG. 11, in the electronic device 200, the main circuit board 7 and the receiver 1 are disposed in the length direction Y of the electronic device 200. The receiver 1 is closer to the top of the electronic device 200 than the main circuit board 7. The fourth part 24 of the first circuit board 2 extends along the length direction Y of the electronic device 200, to be connected to a back side 71 of the main circuit board 7. The connecting portion 44 of the second circuit board 4 extends along the length direction Y of the electronic device 200, to be connected to a front side 72 of the main circuit board 7. The sensor 5 is disposed on one side of the sealing portion 43 of the second circuit board 4 away from the connecting portion 44. The receiving hole 41 is defined on one side of the sealing portion 43 away from the connecting portion 44. The sensor 5 and the receiving hole 41 are disposed in sequence in the width direction X of the electronic device 200.

Reference is made to FIG. 1 to FIG. 19, in which an electronic device 200 is provided. The electronic device 200 includes the foregoing electronic assembly 100. The electronic assembly 100 is received in the electronic device 200 to achieve a receiver function and the like of the electronic device 200. The electronic device 200 may be a smart device such as a tablet computer, a mobile phone, a camera, a personal computer, a notebook computer, an in-vehicle device, and a wearable device.

Because the arrangement of components in the electronic assembly 100 is relatively compact, the space occupied by the electronic assembly 100 inside the electronic device 200 is smaller, and the electronic device 200 can have more other electronic devices disposed in its internal space. This makes the space utilization of the electronic device 200 higher, and the functions of the electronic device 200 are more diversified. Furthermore, the receiver 1, the first circuit board 2, the flashlight 3, the second circuit board 4, and the sensor 5 are stacked in the thickness direction Z of the electronic device 200 in turn, thereby reducing the size occupied by the electronic assembly 100 in the width direction X and the length direction Y of the electronic device 200.

In one implementation, the electronic device 200 includes a display assembly 300. The display assembly 300 has a non-display region 301. The non-display region 301 defines a receiving window 302. The electronic assembly 100 is at least partially directly facing the non-display region 301. The sound of the receiver 1 is sent out through the receiving window 302.

The receiving hole (91, 41) defined in the sealing member 9 (or the second circuit board 4) is directly facing the receiving window 302, such that the sound of the receiver 1 can be transmitted even faster. The sensor 5 and the receiving hole (91, 41) are substantially arranged side by side and are directly facing the non-display region 301. Since the sensor 5 is arranged compactly with the receiving holes (91, 41), the area of the non-display region 301 can be reduced, thereby increasing the screen-to-body ratio of the electronic device 200.

In one implementation, the display assembly 300 further has a display region 303. The display region 303 is adjacent to the non-display region 301. As illustrated in FIG. 1, the display region 303 partially surrounds the non-display region 301. The electronic assembly 100 partially overlaps with the display region 303. Since the electronic assembly 100 partially overlaps with the display region 303, the area of the non-display region 301 can be further reduced, so that a larger screen-to-body ratio of the electronic device 200 can be obtained.

In one implementation, as illustrated in FIG. 1, FIG. 10, FIG. 11, and FIG. 20, the electronic device 200 further includes a main circuit board 7. The main circuit board 7 overlaps with the display region 303. The main circuit board 7 has a reserved region 73. The receiver 1 is disposed in the reserved region 73. The first circuit board 2 and the second circuit board 4 are electrically connected to the main circuit board 7. The receiver 1 and the main circuit board 7 are substantially arranged side by side in the thickness direction Z of the electronic device 200, to reduce the space taken up by the electronic assembly 100 in the thickness direction Z of the electronic device 200.

As illustrated in FIG. 10 and FIG. 11, the first circuit board 2 is electrically connected to the back side 71 of the main circuit board 7, the second circuit board 4 is electrically connected to the front side 72 of the main circuit board 7. In other words, in the thickness direction Z of the electronic device 200, the main circuit board 7 is substantially located between the first circuit board 2 and the second circuit board 4. The electronic assembly 100 and the main circuit board 7 can make better use of the internal space of the electronic device 200 and improve space utilization.

The main circuit board 7 and the receiver 1 are arranged in the length direction Y of the electronic device 200. The receiver 1 is closer to the top of the electronic device 200 than the receiver 1. The fourth part 24 of the first circuit board 2 extends along the length direction Y of the electronic device 200 to be connected to the back side 71 of the main circuit board 7. The connecting portion 44 of the second circuit board 4 extents along the length direction Y of the electronic device 200 to be connected to the front side 72 of the main circuit board 7. The sensor 5 is disposed on one side of the sealing portion 43 of the second circuit board 4 away from the connecting portion 44, making the sensor 5 near the top of the electronic device 200, thereby reducing the area of the non-display region 301, and increasing the screen-to-body ratio of the electronic device 200. The receiving hole (91, 41) are defined on one side of the sealing portion 43 of the second circuit board 4 away from the connecting portion 44, making the receiving window 302 near the top of the electronic device 200, thereby reducing the area of the non-display region 301, and increasing the screen-to-body ratio of the electronic device 200. The sensor 5 and the receiving hole (91, 41) are sequentially arranged in the width direction X of the electronic device 200, this makes the non-display region 301 more regular, the display region 303 has a larger area, and the electronic device 200 has a larger screen-to-body ratio.

In at least one implementation, the sensor 5 partially overlaps with the non-display region 301. The sensor 5 communicates information with outside through the non-display region 301. The receiver 1 at least partially overlaps with the non-display region 301 in such a manner that the receiver 1 can transmit a sound signal(s) to the outside of the electronic device 200.

Figure 21:
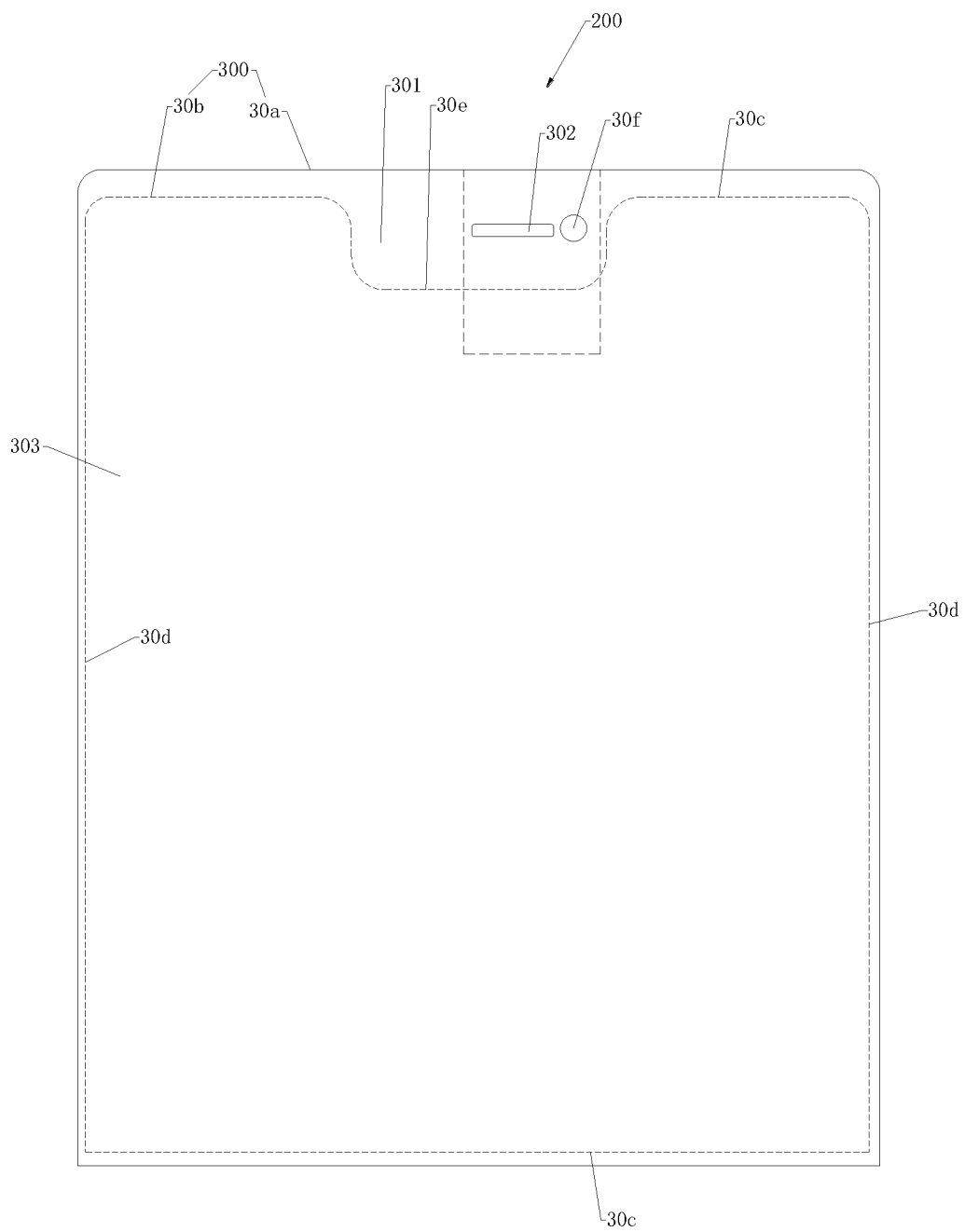
FIG. 21 is a schematic view illustrating cooperation between a display module and the electronic assembly of the electronic device illustrated in FIG. 1.
Figure 22:
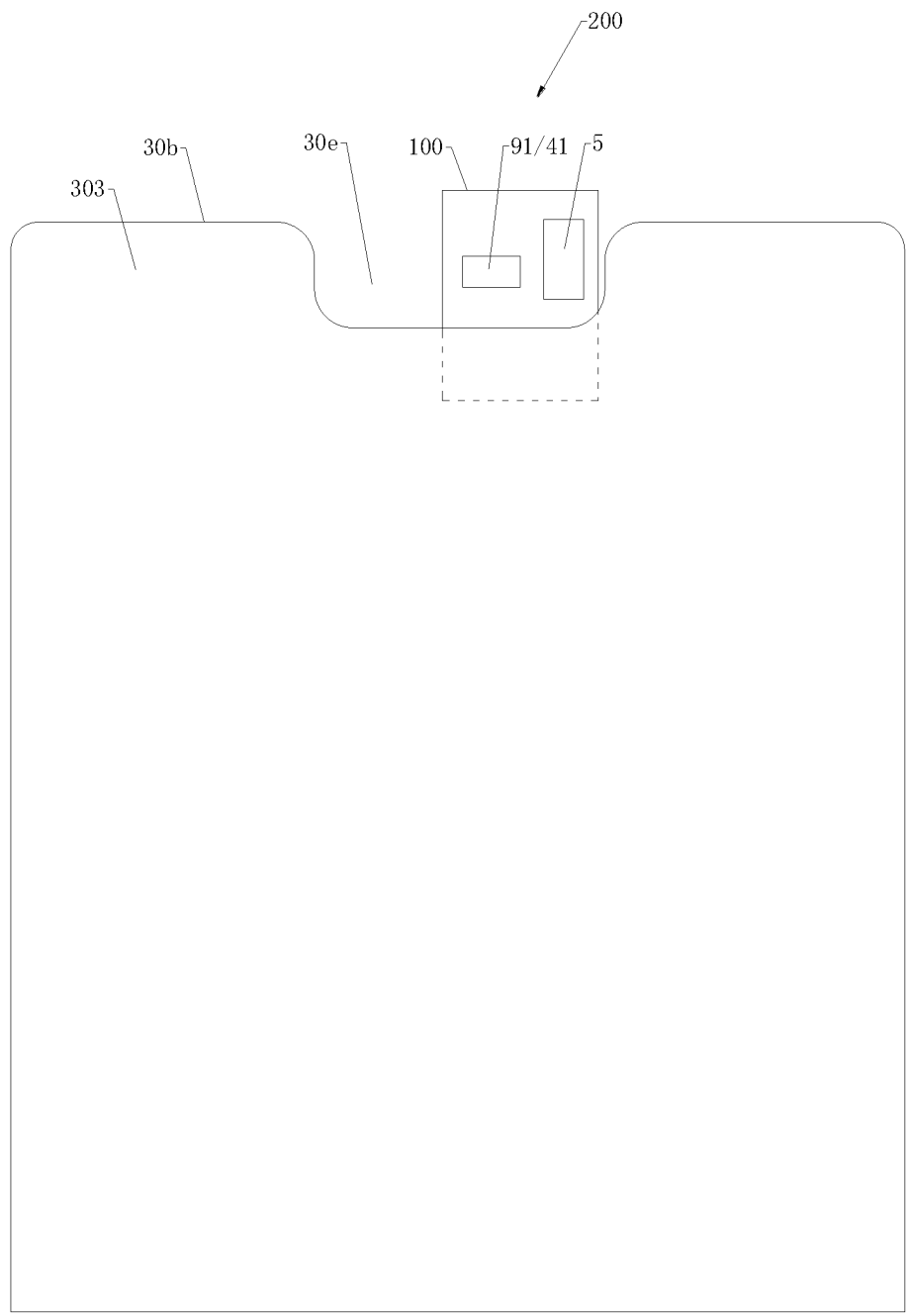
FIG. 22 is a schematic view illustrating cooperation between a display screen and the electronic device illustrated in FIG. 1.
Figure 23:
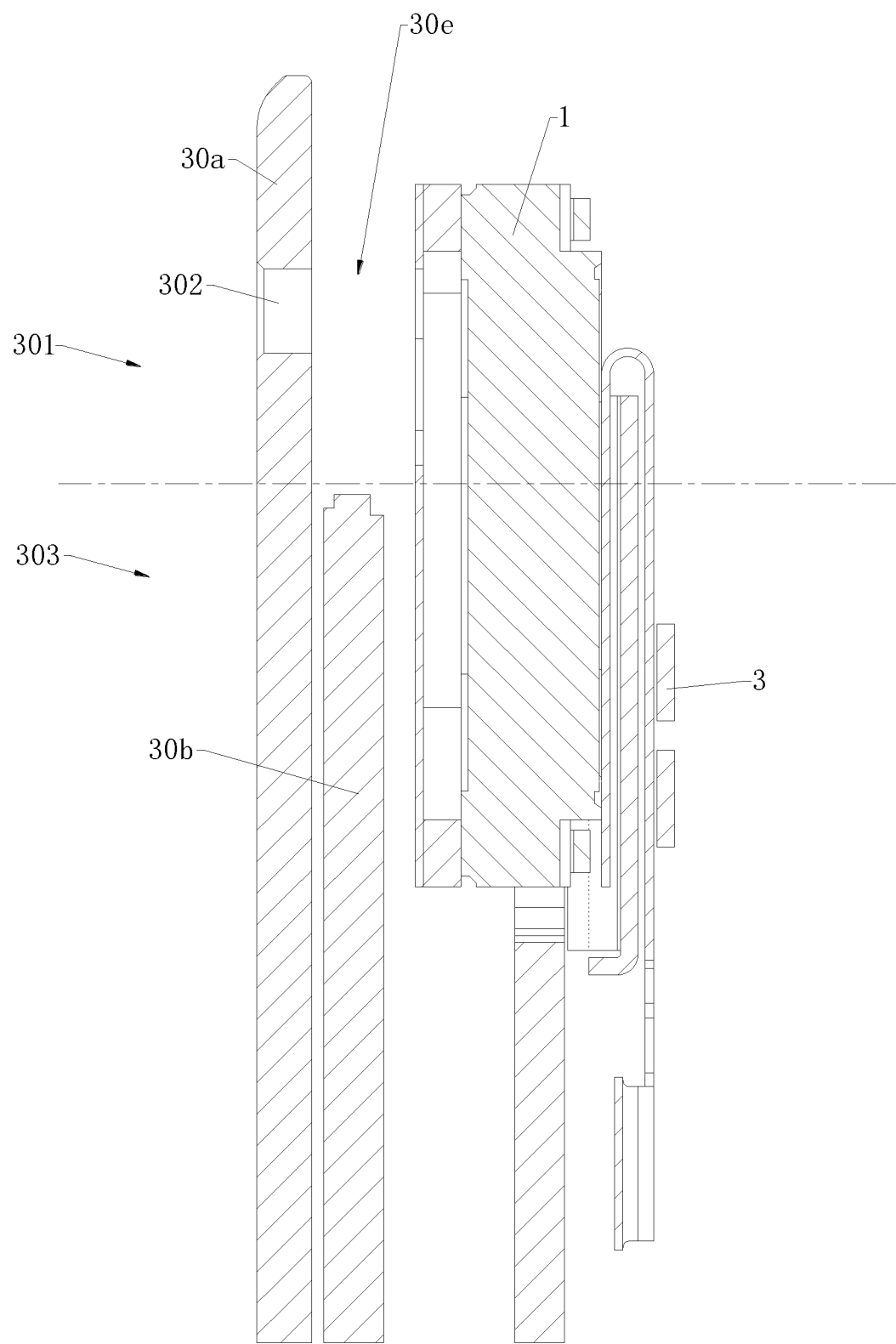
FIG. 23 is a cross-sectional view illustrating part of the structure of the electronic assembly illustrated in FIG. 1 taken along line E-E.
Figure 24:
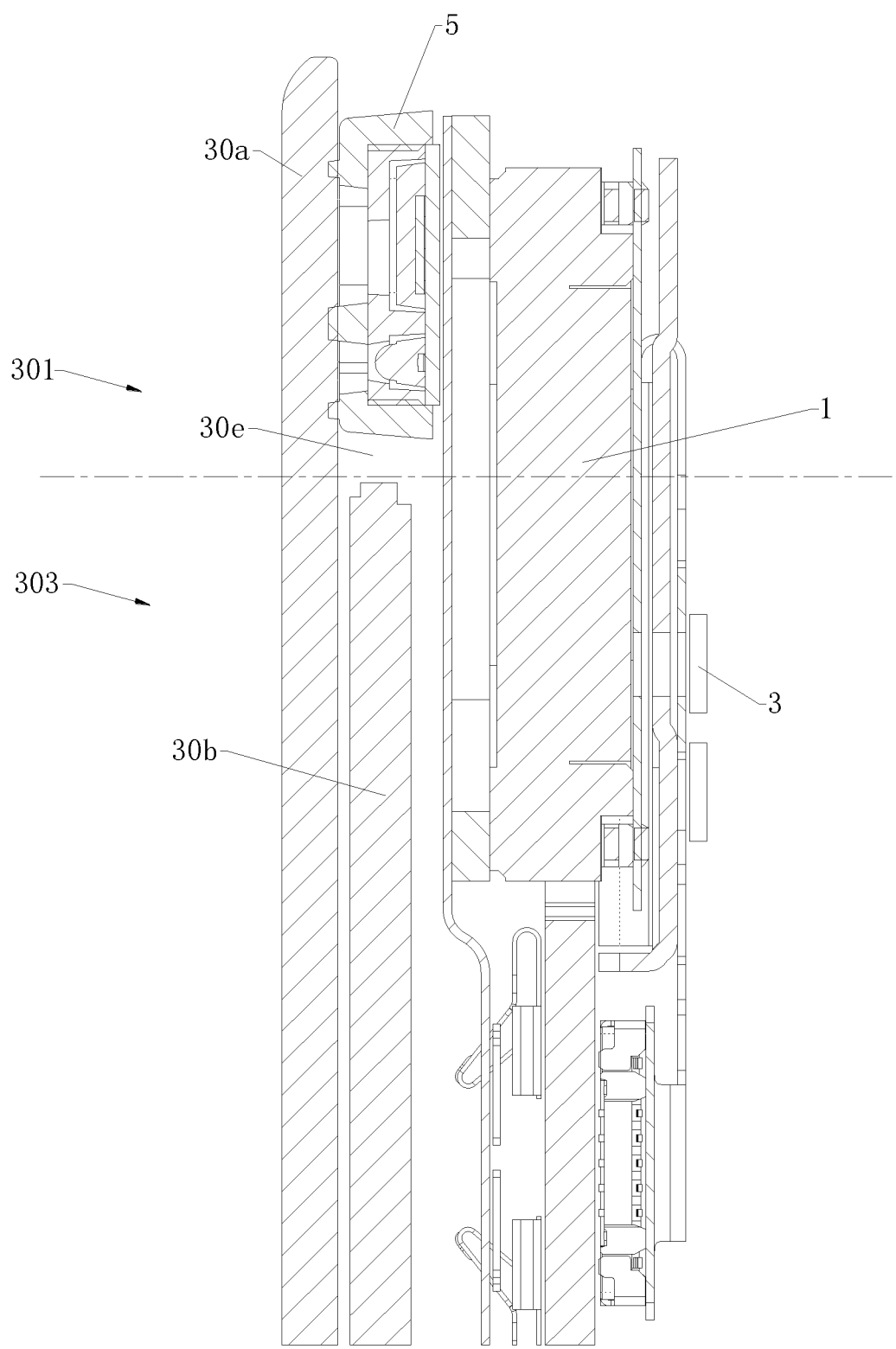
FIG. 24 is a cross-sectional view illustrating part of the structure of the electronic assembly illustrated in FIG. 1 taken along line F-F.

In at least one implementation, as illustrated in FIG. 1, FIG. 21, and FIG. 24, the display assembly 300 includes a cover plate 30*a* and a display screen 30*b*. The cover plate 30*a* is stacked on the display screen 30*b*. A light emitting surface of the display screen 30*b* is adhered to the cover plate 30*a*. The cover plate 30*a* can be made of glass (that is, glass cover). The display screen 30*b* has two opposite short edges 30*c* and two opposite long edges 30*d*. Of the two opposite long edges 30*d*, each is connected between the two short edges 30*c*. The two long edges 30*d* extend in a direction parallel to the length direction Y of the electronic device 200. The two short edges 30*c* extend in a direction parallel to the width direction X of the electronic device 200. Of the two opposite short edges 30*c*, one is partially recessed toward the other one to form a groove 30*e*. The display region 303 of the display assembly 300 is enclosed by the two short edges 30*c* and the two long edges 30*d*. Regions other than the display region 303 is the non-display region 301. The non-display region 301 covers the groove 30*e*. The cover plate 30*a* defines the receiving window 302. The receiving window 302 is directly facing the groove 30*e*. The cover plate 30*a* has a light emitting region 30*f*. The light emitting region 30*f* is directly facing the groove 30*e*. The sensor 5 is directly facing the light emitting region 30*f*.

In this implementation, the sensor 5 is received in the groove 30*e*. The receiving hole (91, 41) is directly facing the groove 30*e*. The receiver 1 is partially directly facing the groove 30*e* and partially overlaps with the display region 303. The flashlight 3 at least partially overlaps with the display region 303. Since the flashlight 3 at least partially overlaps with the display region 303, the size of the groove 30*e* in the length direction Y of the electronic device 200 is smaller, so that the electronic device 200 has a larger screen-to-body ratio. Furthermore, since the sensor 5 overlaps with the receiver 1, the distance between the receiving window 302 and the light transmitting region 30*f* is smaller and the arrangement is more compact, so the area of the groove 30*e* can be reduced and the screen-to-body ratio of the electronic device 200 is larger. The receiving window 302 and the light-transmitting region 30*f* are arranged in the width direction X of the electronic device 200. The compact arrangement of the receiving window 302 and the light-transmitting region 30*f* can reduce the size of groove 30*e* in the width direction X of the electronic device 200.

The size of the groove 30*e* in the direction of the short edge 30*c* is larger than the size of the groove 30*e* in the direction of the long edge 30*d*. The groove 30*e* is substantially rectangular. The display screen 30*b* may be a touch screen.

As illustrated in FIG. 1 to FIG. 24, an electronic device 200 is further provided according to implementations. The electronic device 200 includes the foregoing electronic assembly 100. The electronic device 200 includes a sensor 5, a receiver 1, a flashlight 3, and a display screen 30*b*. The sensor 5, the receiver 1, and the flashlight 3 are stacked in a thickness direction of the display screen 30*b*. The display screen 30*b* is provided with a groove 30*e* at the edge thereof. The sensor 5 and the receiver 1 are at least partially directly facing the groove 30*e*.

In the implementation, since the sensor 5, the receiver 1, and the flashlight 3 are stacked in a thickness direction of the display screen 30*b*, the arrangement of components in the electronic device 200 is relatively compact, and the space occupied is small. The electronic device 200 can have more other electronic devices arranged in its internal space, so that the space utilization of the electronic device 200 is higher, and the functions of the electronic device 200 are more diversified. The sensor 5 at least partially directly facing the groove 30*e* such that the sensor 5 can communicate information with the outside through the groove 30*e*. The receiver 1 is partially directly facing the groove 30*e*, such that the receiver 1 can transmit sound signals to the outside of the electronic device 200. Since the sensor 5 overlaps with the receiver 1 and the two are compactly arranged, the area of the groove 30*e* can be reduced, so that the screen-to-body ratio (screen area) of the electronic device 200 is relatively large.

For details of the electronic device 200 of this implementation, reference can be made to the foregoing electronic device 200, the same or similar description will not be repeated to avoid redundancy.

While the disclosure has been described in connection with certain implementations, it is to be understood that the disclosure is not to be limited to the disclosed implementations but, on the contrary, is intended to cover various modifications and equivalent without departing from the principles of the disclosure.

What is claimed is:

1. An electronic assembly, comprising a receiver, a first circuit board, a flashlight, a second circuit board, and a sensor, wherein the first circuit board has a first surface and a second surface opposite to the first surface, the receiver is disposed on the first surface and electrically connected to the first circuit board, the flashlight is disposed on the second surface and electrically connected to the first circuit board, the second circuit board is disposed on one side of the receiver away from the first circuit board, and the sensor is disposed on one side of the second circuit board away from the receiver and is electrically connected to the second circuit board.

2. The electronic assembly of claim 1, wherein the first circuit board is a flexible circuit board, the first circuit board comprises a first part, a second part opposite to the first part, and a bent third part connected between the first part and the second part, wherein the first surface is a surface of the first part away from the second part, and the second surface is a surface of the second part away from the first part.

3. The electronic assembly of claim 2, wherein the first part is parallel to the second part, an area of an orthographic projection of the flashlight on the first part falls into an area of an orthographic projection of the receiver on the first part.

4. The electronic assembly of claim 2, wherein the electronic assembly further comprises a support frame, and the support frame comprises a supporting portion and a positioning portion, wherein the supporting portion is located between the first part and the second part, and the positioning portion is connected to the supporting portion and used for fixing.

5. The electronic assembly of claim 2, wherein the first circuit board further comprises a fourth part, the fourth part is connected to one side of the second part away from the third part, and the fourth part is staggered with the receiver.

6. The electronic assembly of claim 2, wherein an area of an orthographic projection of the sensor on the second circuit board falls into an area of an orthographic projection of the receiver on the second circuit board.

7. The electronic assembly of claim 6, wherein the second circuit board covers and is tightly connected to part of the receiver, and the electronic assembly further comprises a sealing member connected to the second circuit board, wherein the sealing member covers and is tightly connected to the rest of the receiver, and the sealing member defines a receiving hole to form a sound channel between a vibration portion of the receiver and the receiving hole of the sealing member.

8. The electronic assembly of claim 6, wherein the electronic assembly further comprises a sealing member, the sealing member covers and is tightly connected to the receiver, and the sealing member comprises a first sealing portion and a second sealing portion connected to the first sealing portion; wherein the second sealing portion is stacked on the first sealing portion and has a thickness greater than the first sealing portion, and the second sealing portion defines a receiving hole to form a sound channel between a vibration portion of the receiver and the receiving hole of the sealing member.

9. The electronic assembly of claim 6, wherein the second circuit board covers and is tightly connected to the receiver, and the second circuit board defines a receiving hole to form a sound channel between a vibration portion of the receiver and the receiving hole of the second circuit board.

10. The electronic assembly of claim 9, wherein an orthographic projection of the vibration portion on the second circuit board at least partially covers the receiving hole.

11. The electronic assembly of claim 6, wherein the second circuit board is a flexible circuit board and comprises a sealing portion and a connecting portion, the sealing portion is tightly connected to the receiver, the connecting portion is connected to one side of the sealing portion, and the connecting portion is staggered from the receiver.

12. An electronic device comprising a sensor, a receiver, a flashlight, and a display screen, wherein the sensor, the receiver, and the flashlight are stacked in a thickness direction of the display screen, the display screen is provided with a groove at an edge of the display screen, and the sensor and the receiver are at least partially directly facing the groove.

13. The electronic device of claim 12, wherein the electronic device comprises a first circuit board which is a flexible circuit board, the first circuit board comprising a first part, a second part opposite to the first part, and a bent third part connected between the first part and the second part, wherein the receiver is disposed on one surface of the first part away from the second part and is electrically connected to the first circuit board, and the flashlight is disposed on one surface of the second part away from the first part and is electrically connected to the first circuit board.

14. The electronic device of claim 12, wherein the electronic device comprises a display assembly, the display assembly has a display region and a non-display region adjacent to the display region, the receiver and the flashlight at least partially overlaps with the display region, and the non-display region covers the groove.

15. An electronic device comprising a display assembly and an electronic assembly, wherein the display assembly has a non-display region, the electronic assembly is partially directly facing the non-display region, and the non-display region defines a receiving window; the electronic assembly comprises a receiver, a first circuit board, a flashlight, a second circuit board, and a sensor, sound of the receiver is sent out through the receiving window; the first circuit board has a first surface and a second surface opposite to the first surface, the receiver is disposed on the first surface and electrically connected to the first circuit board, the flashlight is disposed on the second surface and electrically connected to the first circuit board, the second circuit board is disposed on one side of the receiver away from the first circuit board, and the sensor is disposed on one side of the second circuit board away from the receiver and is electrically connected to the second circuit board.

16. The electronic device of claim 15, wherein the display assembly has a display region adjacent to the non-display region, the electronic assembly partially overlaps with the display region; the electronic device further comprises a main circuit board, the main circuit board overlaps with the display region and has a reserved region, the receiver is disposed in the reserved region, and the first circuit board and the second circuit board are electrically connected to the main circuit board.

17. The electronic device of claim 16, wherein the first circuit board is electrically connected to a back side of the main circuit board, the second circuit board is electrically connected to a front side of the main circuit board.

18. The electronic device of claim 16, wherein the sensor partially overlaps with the non-display region, the receiver partially overlaps with the non-display region.

19. The electronic device of claim 15, wherein the first circuit board is a flexible circuit board and comprises a first part, a second part opposite to the first part, and a bent third part connected between the first part and the second part, the first surface is a surface of the first part away from the second part, and the second surface is a surface of the second part away from the first part.

20. The electronic device of claim 15, wherein the display assembly comprises a display screen and a cover plate stacked on the display screen, and the display screen has two opposite long edges and two opposite short edges, wherein of the two opposite long edges, each is connected between the two short edges, and of the two opposite short edges, one is partially recessed toward the other one to form a groove, the non-display region covers the groove, and the receiving window is defined in the cover plate.

\* \* \* \* \*